(12) United States Patent
Chen et al.

(10) Patent No.: US 9,831,305 B1
(45) Date of Patent: Nov. 28, 2017

(54) SEMICONDUCTOR DEVICE AND METHOD FOR MANUFACTURING THE SAME

(71) Applicant: Vanguard International Semiconductor Corporation, Hsinchu (TW)

(72) Inventors: Chu-Feng Chen, New Taipei (TW); Wei-Chun Chou, New Taipei (TW); Chien-Wei Chiu, Beigang Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/148,090

(22) Filed: May 6, 2016

(51) Int. Cl.
*H01L 23/535* (2006.01)
*H01L 29/06* (2006.01)
*H01L 29/66* (2006.01)
*H01L 29/78* (2006.01)

(52) U.S. Cl.
CPC .......... *H01L 29/063* (2013.01); *H01L 23/535* (2013.01); *H01L 29/66477* (2013.01); *H01L 29/78* (2013.01)

(58) Field of Classification Search
CPC ..................................................... H01L 29/063
See application file for complete search history.

(56) References Cited

U.S. PATENT DOCUMENTS

| | | | | |
|---|---|---|---|---|
| 5,605,851 A | * | 2/1997 | Palmieri | H01L 21/2253 257/E21.147 |
| 5,610,421 A | * | 3/1997 | Contiero | H01L 27/0623 257/316 |
| 6,359,318 B1 | * | 3/2002 | Yamamoto | H01L 21/8249 257/339 |
| 6,593,629 B2 | * | 7/2003 | Yamamoto | H01L 29/6625 257/335 |
| 6,927,442 B2 | * | 8/2005 | Kaneko | H01L 27/0623 257/299 |
| 7,547,950 B2 | * | 6/2009 | Kanda | H01L 29/1095 257/401 |

(Continued)

FOREIGN PATENT DOCUMENTS

| | | |
|---|---|---|
| TW | 201143091 A1 | 12/2011 |
| TW | 201340286 A | 10/2013 |
| TW | 201351512 A | 12/2013 |

*Primary Examiner* — Eugene Lee
(74) *Attorney, Agent, or Firm* — Birch, Stewart, Kolasch & Birch, LLP

(57) ABSTRACT

A semiconductor device is provided. The semiconductor device includes a substrate; an epitaxial layer; a first conductive type first well region disposed in the substrate and the epitaxial layer; a second conductive type first buried layer and a second conductive type second buried layer disposed at opposite sides of the first conductive type first well region, respectively; a first conductive type second well region disposed in the epitaxial layer and being in direct contact with the first conductive type first well region; a second conductive type third buried layer disposed in the first conductive type first well region and/or the first conductive type second well region; a second conductive type doped region disposed in the first conductive type second well region; a gate structure; a drain contact plug; and a source contact plug.

10 Claims, 10 Drawing Sheets

(56) References Cited

U.S. PATENT DOCUMENTS

| | | | |
|---|---|---|---|
| 8,546,877 B2* | 10/2013 | Akai | H01L 29/0878 |
| | | | 257/335 |
| 2006/0076612 A1* | 4/2006 | Otake | H01L 21/823807 |
| | | | 257/324 |
| 2011/0062547 A1* | 3/2011 | Onishi | H01L 21/764 |
| | | | 257/510 |
| 2012/0037984 A1* | 2/2012 | Yu | H01L 29/0847 |
| | | | 257/335 |
| 2012/0086052 A1 | 4/2012 | Chen et al. | |
| 2012/0146139 A1* | 6/2012 | Huang | H01L 29/0696 |
| | | | 257/335 |
| 2013/0069154 A1* | 3/2013 | Tsuchiko | H01L 21/8222 |
| | | | 257/335 |
| 2013/0071994 A1 | 3/2013 | Tsuchiko | |
| 2013/0072004 A1 | 3/2013 | Tsuchiko | |
| 2013/0285113 A1* | 10/2013 | Edwards | H01L 27/0262 |
| | | | 257/133 |
| 2015/0243770 A1* | 8/2015 | Hebert | H01L 29/732 |
| | | | 257/586 |
| 2016/0240660 A1* | 8/2016 | Yue | H01L 29/7816 |

* cited by examiner

SEMICONDUCTOR DEVICE AND METHOD FOR MANUFACTURING THE SAME

BACKGROUND OF THE INVENTION

Field of the Invention

The disclosure relates to semiconductor technology, and in particular to a semiconductor device and a method for manufacturing the same

Description of the Related Art

Due to the need for high-yield devices, two or more semiconductor devices may be integrated into one single chip. Bipolar-CMOS-DMOS devices (BCD devices) are widely used in integrated devices. A Bipolar-CMOS-DMOS device integrates a bipolar transistor, a complementary metal-oxide-semiconductor (CMOS), and a double diffused metal-oxide-semiconductor transistor (DMOS) into one single chip.

Recently, a Bipolar-CMOS-DMOS device has been developed that has a higher breakdown voltage. The best-known methods for increasing the breakdown voltage are to increase the thickness of the epitaxial layer or replace the Si substrate with a semiconductor-on-insulator (SOI). However, the aforementioned methods are not cost-effective.

Therefore, a cost-effective semiconductor device which may increase the breakdown voltage and a method for manufacturing the same are needed.

BRIEF SUMMARY OF THE INVENTION

The present disclosure provides a semiconductor device, including: a substrate; an epitaxial layer disposed over the substrate; a first conductive type first well region disposed in the substrate and the epitaxial layer; a second conductive type first buried layer and a second conductive type second buried layer disposed in the substrate and the epitaxial layer, wherein the second conductive type first buried layer and the second conductive type second buried layer are disposed at opposite sides of the first conductive type first well region. The first conductive type is different from the second conductive type. A first conductive type second well region disposed in the epitaxial layer is in direct contact with the first conductive type first well region. A second conductive type third buried layer is disposed in the first conductive type first well region and/or the first conductive type second well region. A second conductive type doped region is disposed in the first conductive type second well region. A gate structure is disposed over the top surface of the epitaxial layer. A drain contact plug is electrically connected to either the first conductive type second well region or the second conductive type doped region. A source contact plug is electrically connected to the other of the first conductive type second well region or the second conductive type doped region.

The present disclosure also provides a method for manufacturing a semiconductor device. The method includes providing a substrate; forming a first conductive type first well region in the substrate; forming a second conductive type first buried layer and a second conductive type second buried layer in the substrate, wherein the second conductive type first buried layer and the second conductive type second buried layer are disposed at opposite sides of the first conductive type first well region, wherein the first conductive type is different from the second conductive type; forming an epitaxial layer over the substrate, wherein the first conductive type first well region, the second conductive type first buried layer and the second conductive type second buried layer extend into the epitaxial layer; forming a second conductive type third buried layer in the substrate and/or the epitaxial layer; forming a first conductive type second well region in the epitaxial layer, wherein the first conductive type second well region is in direct contact with the first conductive type first well region, wherein the second conductive type third buried layer is disposed in the first conductive type first well region and/or the first conductive type second well region; forming a second conductive type doped region in the first conductive type second well region; forming a gate structure over the top surface of the epitaxial layer; forming a drain contact plug, wherein the drain contact plug is electrically connected to either the first conductive type second well region or the second conductive type doped region; and forming a source contact plug, wherein the source contact plug is electrically connected to the other of the first conductive type second well region or the second conductive type doped region.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE INVENTION

Figure 1A:
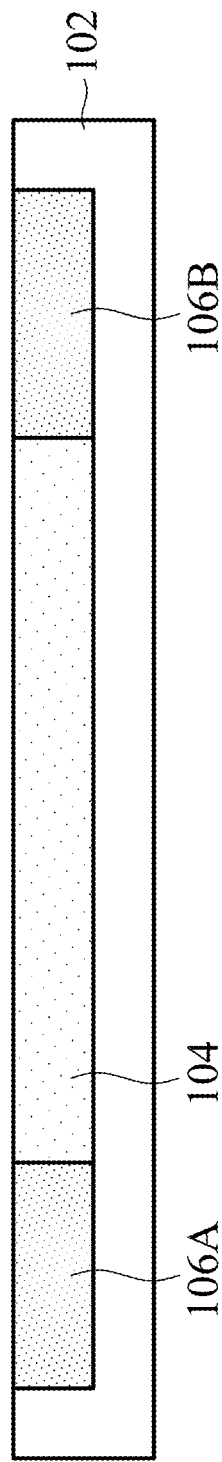
FIG. 1A is a cross-sectional view of a semiconductor device in one step of a manufacturing method of the semiconductor device according with some embodiments of the present disclosure.

The semiconductor device of the present disclosure and the method for manufacturing this semiconductor device are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/− 20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines.

The embodiment of the present disclosure replaces a portion of the second conductive type buried layer of the known semiconductor device with a first conductive type well region to increase the breakdown voltage of the semiconductor device. Thereby, the semiconductor device may be used in the application with higher operation voltage. For example, the semiconductor device may be used in the application in which the operation voltage higher than 100V.

In addition, since the embodiment of the present disclosure merely change the configuration of the doped regions without increasing the thickness of the epitaxial layer or replacing the Si substrate with the semiconductor-on-insulator (SOI), the breakdown voltage of the semiconductor device may be increased without greatly increasing the manufacturing cost.

FIG. 1A is a cross-sectional view of a semiconductor device in one step of a manufacturing method of the semiconductor device according with some embodiments of the present disclosure. As shown in FIG. 1A, a substrate 102 is provided. The substrate 102 may include, but is not limited to, semiconductor substrate such as a silicon substrate. In addition, the substrate 102 may include an element semiconductor which may include germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy; or a combination thereof. In some embodiments of the present disclosure, the substrate 102 may be a lightly doped substrate, for example, a substrate lightly doped with the second conductive type dopant. In some embodiments of the present disclosure, when the second conductive type is P-type, the substrate 102 may be a P-type substrate.

Subsequently, a first conductive type first well region 104, a second conductive type first buried layer 106A and a second conductive type second buried layer 106B are formed in the substrate 102. The second conductive type first buried layer 106A and the second conductive type second buried layer 106B are disposed at opposite sides of the first conductive type first well region 104. The first conductive type is different from the second conductive type.

The formation sequence or order of the first conductive type first well region 104, the second conductive type first buried layer 106A and the second conductive type second buried layer 106B is not limited. In some embodiments of the present disclosure, the first conductive type first well region 104 is formed first, and then the second conductive type first buried layer 106A and the second conductive type second buried layer 106B are formed. However, in some other embodiments of the present disclosure, the second conductive type first buried layer 106A and the second conductive type second buried layer 106B are formed first, then the first conductive type first well region 104 is formed.

In some embodiments of the present disclosure, the first conductive type first well region 104 may be formed by ion implantation. For example, when the first conductive type is N-type, the predetermined region for the first conductive type first well region 104 may be implanted with phosphorous ions or arsenic ions to form the first conductive type first well region 104.

In some embodiments of the present disclosure, the second conductive type first buried layer 106A and the second conductive type second buried layer 106B may be formed by ion implantation. For example, when the second conductive type is P-type, the predetermined region for the second conductive type first buried layer 106A and the second conductive type second buried layer 106B may be implanted with boron ion, indium ion or boron difluoride ion ($BF_2^+$) to form the second conductive type first buried layer 106A and the second conductive type second buried layer 106B.

Figure 1B:
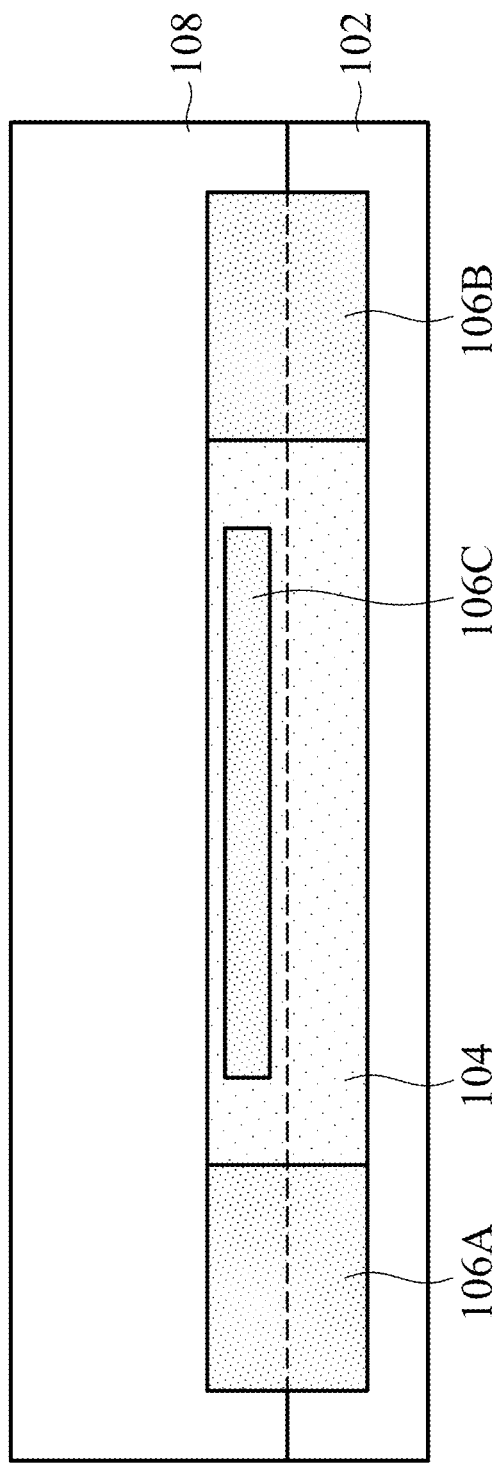
FIG. 1B is a cross-sectional view of a semiconductor device in one step of a manufacturing method of the semiconductor device according with some embodiments of the present disclosure.

Subsequently, FIG. 1B is a cross-sectional view of a semiconductor device in one step of a manufacturing method of the semiconductor device according with some embodiments of the present disclosure. As shown in FIG. 1B, an epitaxial layer 108 is formed over the substrate 102. The epitaxial layer 108 may include, but is not limited to, Si, Ge, Si/Ge, III-V compound, or a combination thereof. The epitaxial layer 108 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

In some embodiments of the present disclosure, the epitaxial layer 108 may be an un-doped epitaxial layer. However, in some other embodiments of the present disclosure, the epitaxial layer 108 has a second conductive type. For example, when the second conductive type is P-type, the epitaxial layer 108 is a P-type epitaxial layer. The P-type epitaxial layer may be formed by adding borane ($BH_3$) or boron tribromide ($BBr_3$) into the reaction gas to perform in-situ doping when depositing the epitaxial layer 108. Alternatively, the un-doped epitaxial layer 108 may be deposited first, then the un-doped epitaxial layer 108 is ion-implanted by boron ion or indium ion.

In addition, since the epitaxial growth step is performed under high temperature, for example, under 1180° C., the first conductive type dopant of the first conductive type first well region 104 and the second conductive type dopant of the second conductive type first buried layer 106A and the second conductive type second buried layer 106B may extend upward into the epitaxial layer 108 in the epitaxial growth step. Therefore, the first conductive type first well region 104, the second conductive type first buried layer 106A and the second conductive type second buried layer 106B may extend into the epitaxial layer 108. In other words, the first conductive type first well region 104, the second conductive type first buried layer 106A and the second conductive type second buried layer 106B may be disposed in the substrate 102 and the epitaxial layer 108 in the same time.

Still referring to FIG. 1B, a second conductive type third buried layer 106C is formed in the substrate 102 and/or the epitaxial layer 108. For example, in some embodiments of the present disclosure, as shown in FIG. 1B, the second conductive type third buried layer 106C is formed in the epitaxial layer 108.

In some embodiments of the present disclosure, the second conductive type third buried layer 106C may be formed by ion implantation. For example, when the second conductive type is P-type, the predetermined region for the second conductive type third buried layer 106C may be implanted with boron ion, indium ion or boron difluoride ion ($BF_2^+$) to form the second conductive type third buried layer 106C.

It should be noted that, although the second conductive type third buried layer 106C shown in FIG. 1B is disposed only in the epitaxial layer 108, the second conductive type third buried layer 106C may be disposed in the substrate 102 and the epitaxial layer 108 in the same time. Alternatively, the second conductive type third buried layer 106C may be disposed only in the substrate 102. In addition, although the second conductive type third buried layer 106C shown in FIG. 1B is formed after the epitaxial layer 108, the second conductive type third buried layer 106C may be formed before the epitaxial layer 108. This will be described in detail in the following description. Therefore, the inventive concept and scope are not limited to the exemplary embodiment shown in FIG. 1B.

Figure 1C:
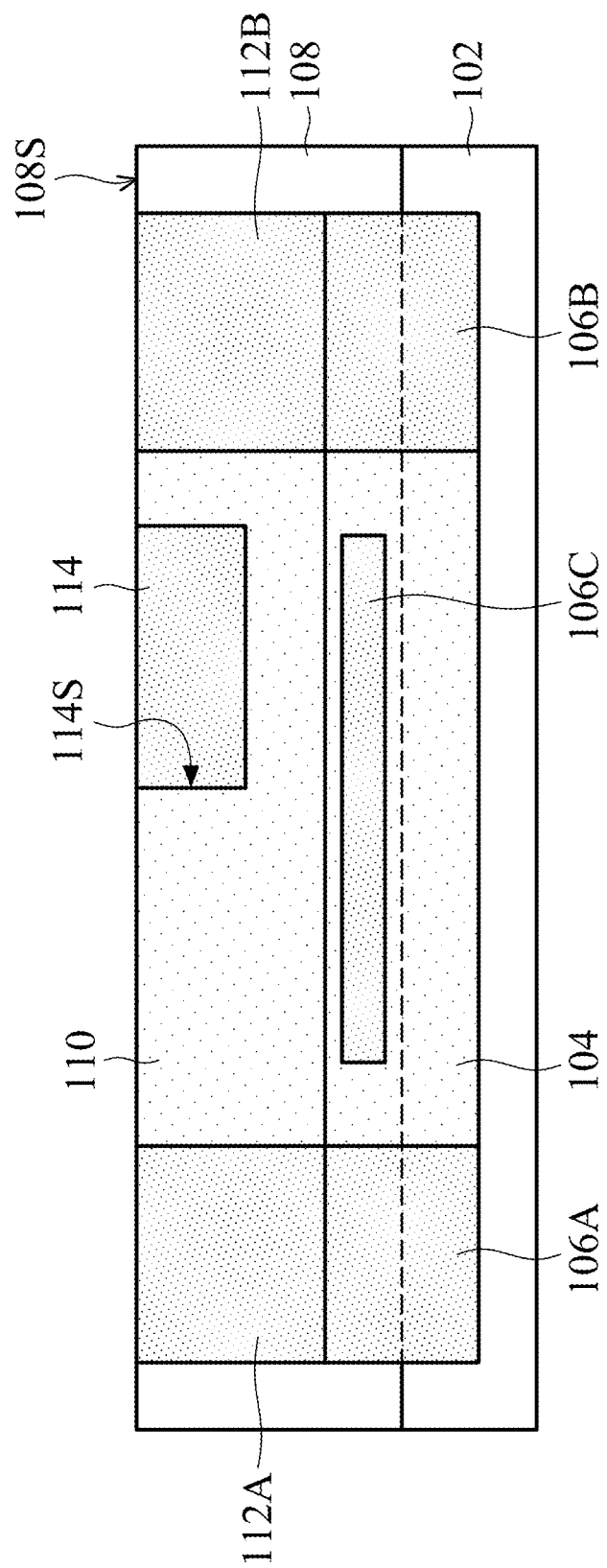
FIG. 1C is a cross-sectional view of a semiconductor device in one step of a manufacturing method of the semiconductor device according with some embodiments of the present disclosure.

Subsequently, FIG. 1C is a cross-sectional view of a semiconductor device in one step of a manufacturing method of the semiconductor device according with some embodiments of the present disclosure. As shown in Subsequently, FIG. 1C, a first conductive type second well region 110, a second conductive type first well region 112A and a second conductive type second well region 112B are formed in the epitaxial layer 108. The second conductive type first well region 112A and the second conductive type second well region 112B are disposed at opposite sides of the first conductive type second well region 110.

The formation sequence or order of the first conductive type second well region 110, the second conductive type first well region 112A and the second conductive type second well region 112B is not limited. In some embodiments of the present disclosure, the first conductive type second well region 110 is formed first, and then the second conductive type first well region 112A and the second conductive type second well region 112B are formed. However, in some other embodiments of the present disclosure, the second conductive type first well region 112A and the second conductive type second well region 112B are formed first, then the first conductive type second well region 110 is formed.

In some embodiments of the present disclosure, the first conductive type second well region 110 may be formed by ion implantation. For example, when the first conductive type is N-type, the predetermined region for the first conductive type second well region 110 may be implanted with phosphorous ions or arsenic ions to form the first conductive type second well region 110.

In some embodiments of the present disclosure, the second conductive type first well region 112A and the second conductive type second well region 112B may be formed by ion implantation. For example, when the second conductive type is P-type, the predetermined region for the second conductive type first well region 112A and the second conductive type second well region 112B may be implanted with boron ion, indium ion or boron difluoride ion ($BF_2^+$) to form the second conductive type first well region 112A and the second conductive type second well region 112B.

In addition, still referring to FIG. 1C, in some embodiments of the present disclosure, the first conductive type second well region 110 is in direct contact with the first conductive type first well region 104. In addition, the first conductive type second well region 110 is in direct contact with the top surface 108S of the epitaxial layer 108.

In addition, in some embodiments of the present disclosure, the second conductive type first well region 112A is in direct contact with the second conductive type first buried layer 106A, and the second conductive type second well region 112B is in direct contact with the second conductive type second buried layer 106B. In addition, the second conductive type first well region 112A and the second conductive type second well region 112B are also in direct contact with the top surface 108S of epitaxial layer 108.

In addition, the second conductive type third buried layer 106C is disposed in the first conductive type first well region 104 and/or the first conductive type second well region 110. For example, in some embodiments of the present disclosure, as shown in FIG. 1C, the second conductive type third buried layer 106C is disposed in the first conductive type first well region 104.

However, it should be noted that, although the second conductive type third buried layer 106C shown in FIG. 1C is disposed only in the first conductive type first well region 104, the second conductive type third buried layer 106C may be disposed in the first conductive type second well region 110 and the first conductive type first well region 104 in the same time. Alternatively, the second conductive type third buried layer 106C may be disposed only in the first conductive type second well region 110. This will be described in detail in the following description. Therefore, the inventive concept and scope are not limited to the exemplary embodiment shown in FIG. 1C.

Still referring to FIG. 1C, a second conductive type doped region 114 is formed in the first conductive type second well region 110. In some embodiments of the present disclosure, the second conductive type doped region 114 is in direct contact with the top surface 108S of the epitaxial layer 108. In some embodiments of the present disclosure, the second conductive type doped region 114 may be formed by ion implantation. For example, when the second conductive type is P-type, the predetermined region for the second conductive type doped region 114 may be implanted with boron ion, indium ion or boron difluoride ion ($BF_2^+$) to form the second conductive type doped region 114.

In addition, in some embodiments of the present disclosure, the second conductive type doped region 114 does not physically contact the second conductive type first buried layer 106A, the second conductive type second buried layer 106B, the second conductive type first well region 112A, the second conductive type second well region 112E and the second conductive type third buried layer 106C. In addition, in some embodiments of the present disclosure, the second conductive type third buried layer 106C does not physically contact the second conductive type first buried layer 106A, the second conductive type second buried layer 106B, the second conductive type first well region 112A, the second conductive type second well region 112B and the second conductive type doped region 114.

Figure 1D:
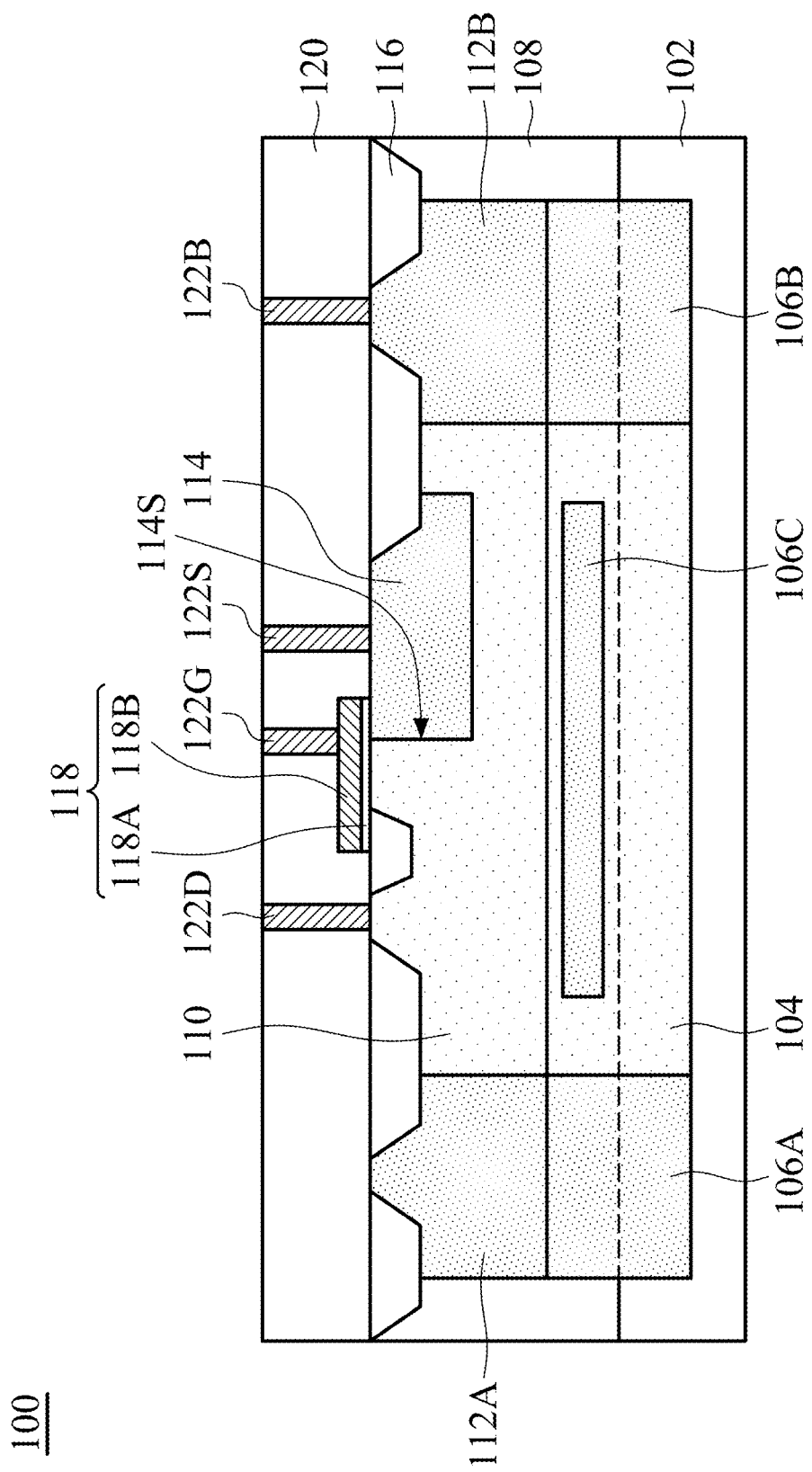
FIG. 1D is a cross-sectional view of a semiconductor device in one step of a manufacturing method of the semiconductor device according with some embodiments of the present disclosure.

Subsequently, FIG. 1D is a cross-sectional view of a semiconductor device in one step of a manufacturing method of the semiconductor device according with some embodiments of the present disclosure. As shown in FIG. 1D, a plurality of isolation structures 116 is formed in the epitaxial layer 108. In some embodiments of the present disclosure, the isolation structures 116 may be shallow trench isolations.

In some embodiments of the present disclosure, the shallow trench isolation 116 may be formed with the following steps. First, a trench is formed at the predetermined region for the shallow trench isolation 116. In some embodiments of the present disclosure, the trench may be formed by an etch process. The etch process may include wet etch, dry etch, or a combination thereof. The wet etch may include, but is not limited to, immersion etching, spray etching, or any other suitable etch process, or a combination thereof. The dry etch may include, but is not limited to, capacitively coupled plasma etching, inductively-coupled plasma etching, helicon plasma etching, electron cyclotron resonance plasma etching or any other suitable dry etch process, or a combination thereof. The dry etch process employs a process gas, which may include, but is not limited to, inert gas, fluorine-containing gas, chlorine-containing gas, bromine-containing gas, iodine-containing gas, a combination thereof or any other suitable gases. In some embodiments of the present disclosure, the processing gas may include, but is not limited to, Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof or any other suitable gases.

Subsequently, an insulating material may be filled into the trench to form the shallow trench isolation 116. The insulating material may include, but are not limited to, silicon oxide, silicon nitride, silicon oxynitride formed by chemical vapor deposition (CVD), any other suitable insulating materials, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIG. 1D, a gate structure 118 is formed over the top surface 108S of the epitaxial layer 108. The gate structure 118 includes a gate dielectric layer 118A and a gate electrode 118B disposed over the gate dielectric layer 118A.

In some embodiments of the present disclosure, a dielectric material layer (not shown, for forming the gate dielectric layer 118A) and a conductive material layer (not shown, for forming the gate electrode 118B) thereon may be blanketly deposited over substrate 102 sequentially. Subsequently, the gate dielectric layer 118A and the gate electrode 118B are respectively formed from the dielectric material layer and the conductive material layer by patterning the above two layers through the photolithography and etching steps.

The material of the dielectric material layer (i.e. The material of the gate dielectric layer 118A) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, any other suitable high-k dielectric material, or a combination thereof. The dielectric material layer may be formed by the previously described chemical vapor deposition or spin-on coating as described previously.

The material of the conductive material layer (i.e. The material of the gate electrode 118B) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previously described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material layer may range from about 1000 Å to 10000 Å.

Subsequently, still referring to FIG. 1D, an interlayer dielectric layer 120 is formed. The material of the interlayer dielectric layer 120 may include, but is not limited to, silicon oxide, silicon nitride, silicon oxynitride, boron phosphorus silicate glass (BPSG), phosphorus silicate glass (PSG), spin-on glass (SOG), dielectric material formed by high density plasma, or any other suitable dielectric material, or a combination thereof. The interlayer dielectric layer 120 may be formed by the previously described chemical vapor deposition or spin-on coating and patterning steps.

Subsequently, a drain contact plug 122D, a gate contact plug 122G, a source contact plug 122S and a bulk contact plug 122B are formed in the interlayer dielectric layer 120 to form the semiconductor device 100.

The drain contact plug 122D is electrically connected to either the first conductive type second well region 110 or the second conductive type doped region 114, and the source contact plug 122S is electrically connected to the other of the first conductive type second well region 110 or the second conductive type doped region 114. For example, in some embodiments of the present disclosure, as shown in FIG. 1D, the drain contact plug 122D is electrically connected to the first conductive type second well region 110, and the source contact plug 122S is electrically connected to the second conductive type doped region 114.

In addition, the gate contact plug 122G is electrically connected to gate electrode 118B, and the bulk contact plug 122B is electrically connected to the second conductive type second well region 112B. The bulk contact plug 122B is used to collect the redundant carriers in the device. For example, the bulk contact plug 122B may be used to collect the redundant electron holes or electrons.

In addition, the second conductive type doped region 114 has an edge 114S disposed between the drain contact plug 122D and the source contact plug 122S. The gate structure 118 is disposed corresponding to the edge 114S. In other words, the gate structure 118 is disposed over the edge 114S of the second conductive type doped region 114, and the drain contact plug 122D and the source contact plug 122S are disposed at the opposite sides of the gate structure 118 and the gate contact plug 122G, respectively.

In some embodiments of the present disclosure, the material of the drain contact plug 122D, the gate contact plug 122G, the source contact plug 122S and the bulk contact plug 122B may include, but is not limited to, a single layer or multiple layers of copper, aluminum, tungsten, gold, chromium, nickel, platinum, titanium, iridium, rhodium, an alloy thereof, a combination thereof, or any other metal material with good conductivity. In some other embodiments of the present disclosure, the material of the drain contact plug 122D, the gate contact plug 122G, the source contact plug 122S and the bulk contact plug 122B may include a nonmetal material as long as the material is conductive. The drain contact plug 122D, the gate contact plug 122G, the source contact plug 122S and the bulk contact plug 122B may be formed by the previously described chemical vapor deposition (CVD), sputtering, resistive thermal evaporation, electron beam evaporation, or any other suitable methods.

In some embodiments, the materials of the drain contact plug 122D, the gate contact plug 122G, the source contact plug 122S and the bulk contact plug 122B may be the same, and the drain contact plug 122D, the gate contact plug 122G, the source contact plug 122S and the bulk contact plug 122B may be formed by the same deposition steps. However, in other embodiments, the drain contact plug 122D, the gate contact plug 122G, the source contact plug 122S and the bulk contact plug 122B may be formed by different deposition steps, and the materials of the drain contact plug 122D, the gate contact plug 122G, the source contact plug 122S and the bulk contact plug 122B may be different from each other.

Still referring to FIG. 1D, the semiconductor device 100 includes the substrate 102 and the epitaxial layer 108 disposed over the substrate 102. The semiconductor device 100 further includes the first conductive type first well region 104 disposed in the substrate 102 and the epitaxial layer 108 and the second conductive type first buried layer 106A and the second conductive type second buried layer 106B disposed in the substrate 102 and the epitaxial layer 108. The second conductive type first buried layer 106A and the second conductive type second buried layer 106B are disposed at opposite sides of the first conductive type first well region 104. The first conductive type is different from the second conductive type. The semiconductor device 100 further includes the first conductive type second well region 110 disposed in the epitaxial layer 108 and being in direct contact with the first conductive type first well region 104. The semiconductor device 100 further includes the second conductive type third buried layer 106C disposed in the first conductive type first well region 104 and/or the first conductive type second well region 110. The semiconductor device 100 further includes the second conductive type doped region 114 disposed in the first conductive type second well region 110 and the gate structure 118 disposed over the top surface 108S of the epitaxial layer 108. The semiconductor device 100 further includes the drain contact plug 122D electrically connected to either the first conductive type second well region 110 or the second conductive type doped region 114. The semiconductor device 100 further includes the source contact plug 122S electrically connected to the other of the first conductive type second well region 110 or the second conductive type doped region 114.

In addition, in some embodiments of the present disclosure, the semiconductor device 100 further includes the second conductive type first well region 112A and second conductive type second well region 112B disposed in the epitaxial layer 108. The second conductive type first well region 112A and the second conductive type second well region 112B are disposed at opposite sides of the first conductive type second well region 110.

In addition, in some embodiments of the present disclosure, the semiconductor device 100 may include Bipolar-CMOS-DMOS device (BCD device).

The embodiment of the present disclosure replaces a portion of the second conductive type buried layer of the known semiconductor device with the first conductive type first well region 104 to increase the breakdown voltage of the semiconductor device. In particular, in some other embodiments of the present disclosure, the region of the first conductive type first well region 104 shown in FIG. 1D is replaced by another second conductive type buried layer. The dopant type and the dopant concentration of this second conductive type buried layer are the same as that of the second conductive type first buried layer 106A and the second conductive type second buried layer 106B. Therefore, this second conductive type buried layer, the second conductive type first buried layer 106A and the second conductive type second buried layer 106B are together referred as a second conductive type bottom buried layer. In this embodiment, the breakdown voltage of the semiconductor device is lower than 100V. Furthermore, in some embodiments of the present disclosure, the breakdown voltage of the semiconductor device is lower than 80V, 60V or 40V.

In comparison, in the semiconductor device 100 shown in FIG. 1D of the present disclosure, a portion of the second conductive type bottom buried layer mentioned above is replaced by the first conductive type first well region 104 shown in FIG. 1D. since the first conductive type dopant in the first conductive type first well region 104 may reduce the concentration of the second conductive type dopant in the substrate 102, the breakdown voltage of the semiconductor device 100 may be increased further. For example, in some embodiments of the present disclosure, the breakdown voltage of the semiconductor device 100 may be greater than or equal to 120V, 140V, 150V, or even 160V. Since the semiconductor device 100 of the embodiments of the present disclosure has higher breakdown voltage, the semiconductor device 100 may be used in the application with higher operation voltage. For example, the semiconductor device 100 may be used in the application in which the operation voltage is greater than or equal to 100V or 120V.

In addition, since the embodiment of the present disclosure merely change the configuration of the doped regions without increasing the thickness of the epitaxial layer or replacing the Si substrate with the semiconductor-on-insulator (SOI), the breakdown voltage of the semiconductor device 100 may be increased without greatly increasing the manufacturing cost.

In addition, as shown in FIG. 1D, since the second conductive type third buried layer 106C is disposed in the first conductive type first well region 104 and/or the first conductive type second well region 110, and the second conductive type third buried layer 106C is not electrically connected to other second conductive type doped region, the second conductive type third buried layer 106C, the first conductive type first well region 104 and the first conductive type second well region 110 together form a reduced surface field structure (RESURF structure). The reduced surface field structure may further increase the breakdown voltage of the semiconductor device 100.

Figure 2A:
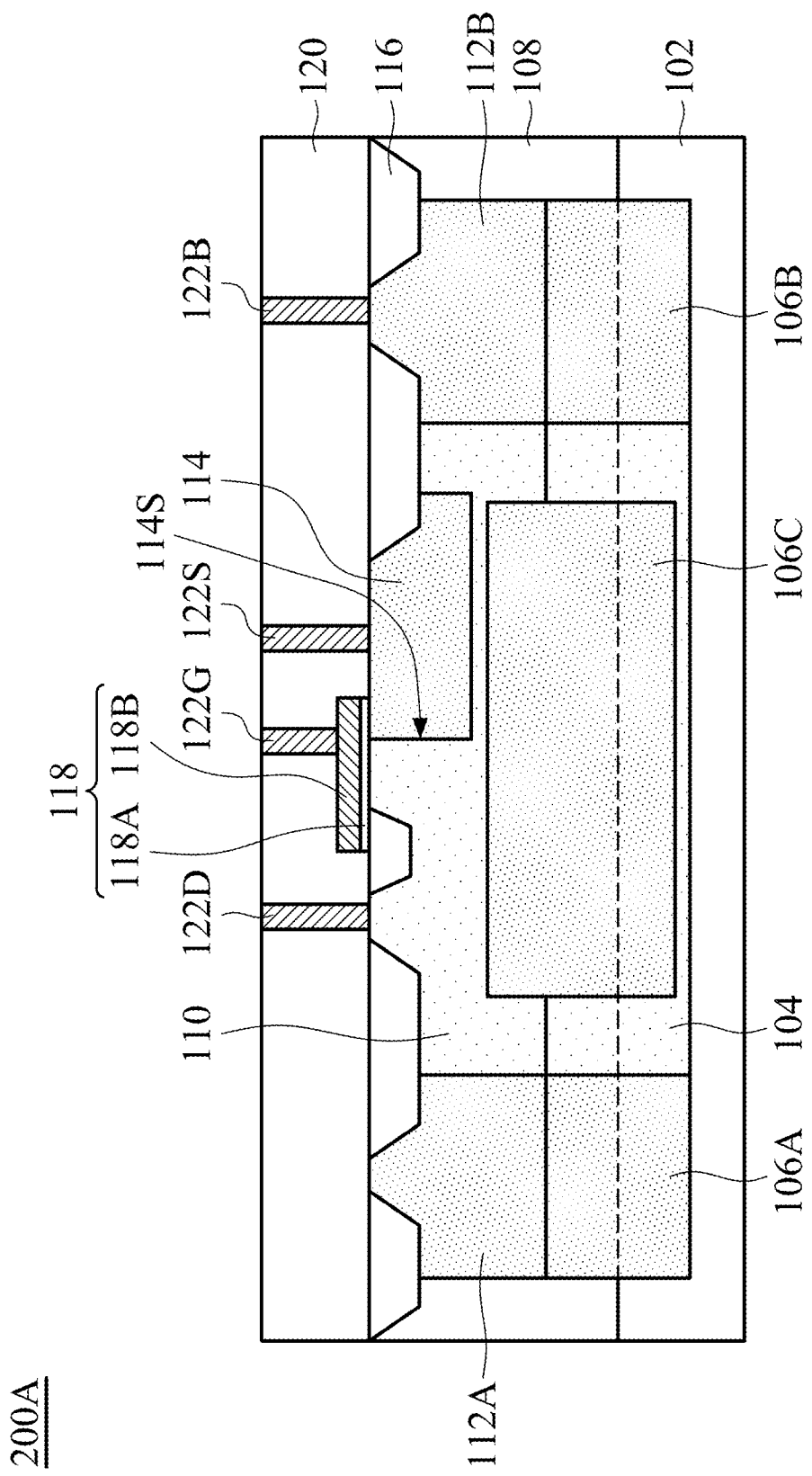
FIG. 2A is a cross-sectional view of a semiconductor device in accordance with another embodiment of the present disclosure.
Figure 2B:
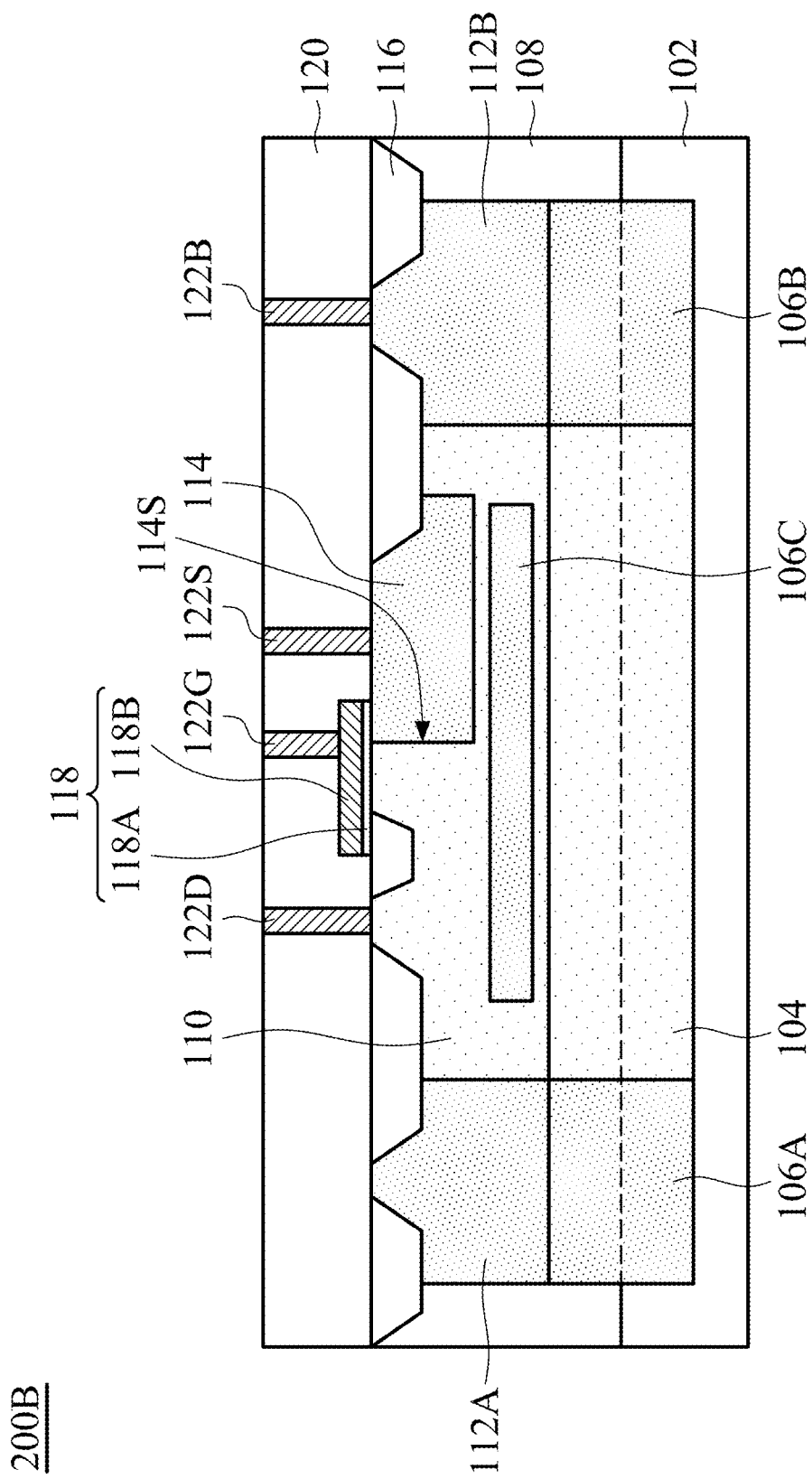
FIG. 2B is a cross-sectional view of a semiconductor device in accordance with another embodiment of the present disclosure.

It should be noted that the exemplary embodiment set forth in FIGS. 1A-1D is merely for the purpose of illustration. In addition to the embodiment set forth in FIGS. 1A-1D, the second conductive type third buried layer may have other configuration as shown in FIGS. 2A-2B. This will be described in detail in the following description. Therefore, the inventive concept and scope are not limited to the exemplary embodiment shown in FIGS. 1A-1D.

FIG. 2A is a cross-sectional view of a semiconductor device 200A in accordance with another embodiment of the present disclosure. As shown in FIG. 2A, the second conductive type third buried layer 106C is disposed in the first conductive type first well region 104 and the first conductive type second well region 110.

FIG. 2B is a cross-sectional view of a semiconductor device 200B in accordance with another embodiment of the present disclosure. As shown in FIG. 2B, the second conductive type third buried layer 106C is disposed only in the first conductive type second well region 110.

In addition, although the second conductive type third buried layer 106C shown in FIGS. 1A-1D is formed after the epitaxial layer 108, the second conductive type third buried layer 106C may be formed before the epitaxial layer 108. This will be described in detail in the following description. Therefore, the inventive concept and scope are not limited to the exemplary embodiment shown in FIGS. 1A-1D.

Figure 2C:
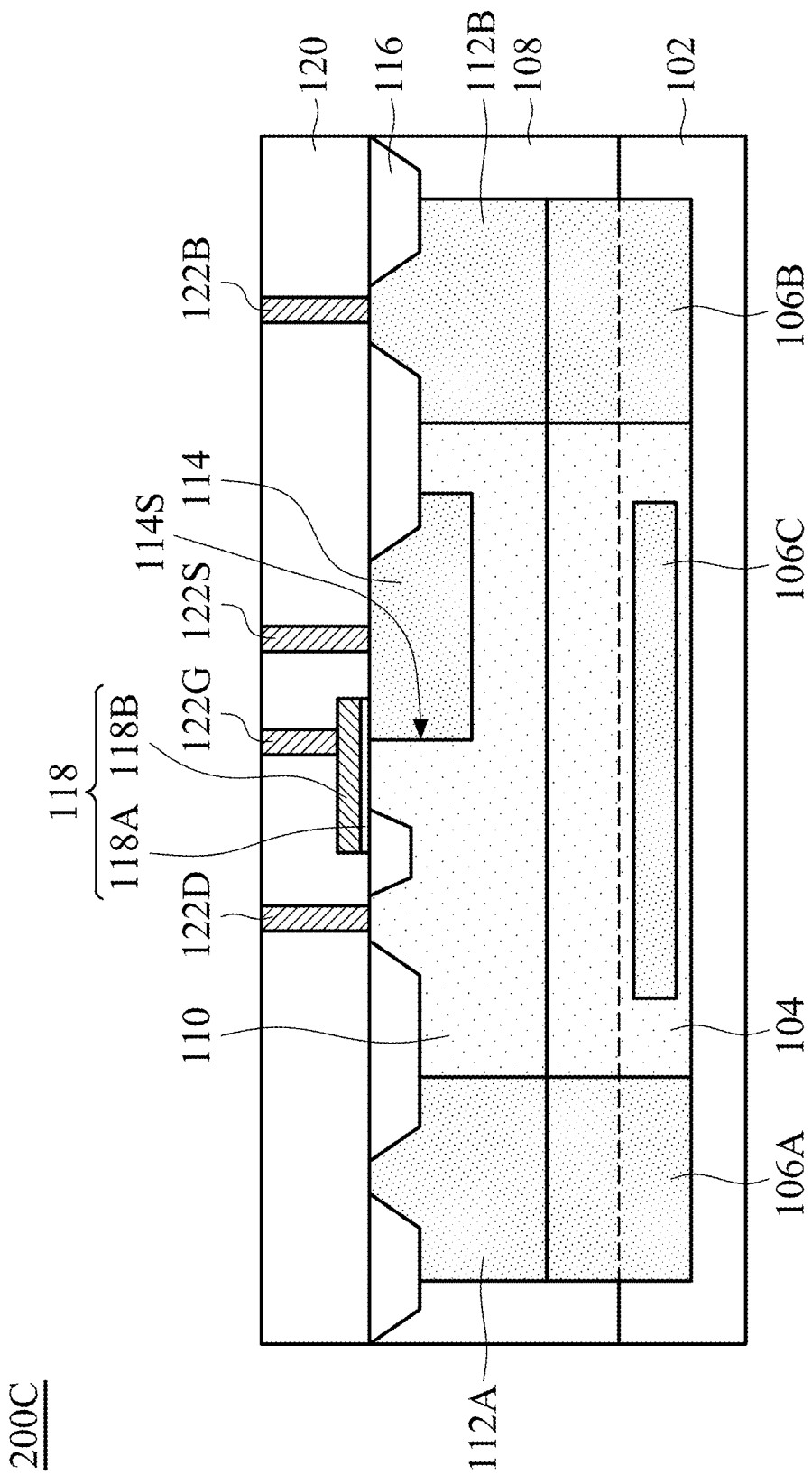
FIG. 2C is a cross-sectional view of a semiconductor device in accordance with another embodiment of the present disclosure.

FIG. 2C is a cross-sectional view of a semiconductor device 200C in accordance with another embodiment of the present disclosure. As shown in FIG. 2C, the second conductive type third buried layer 106C is formed in the substrate 102 before the epitaxial layer 108 is formed. In addition, the second conductive type third buried layer 106C is disposed only in the substrate 102.

Alternatively, in some other embodiments of the present disclosure, the second conductive type third buried layer 106C is formed in the substrate 102 before the epitaxial layer 108, and the second conductive type third buried layer 106C may diffuse and extend into the epitaxial layer 108 in the step of forming the epitaxial layer 108, as shown in FIG. 2A.

Figure 3A:
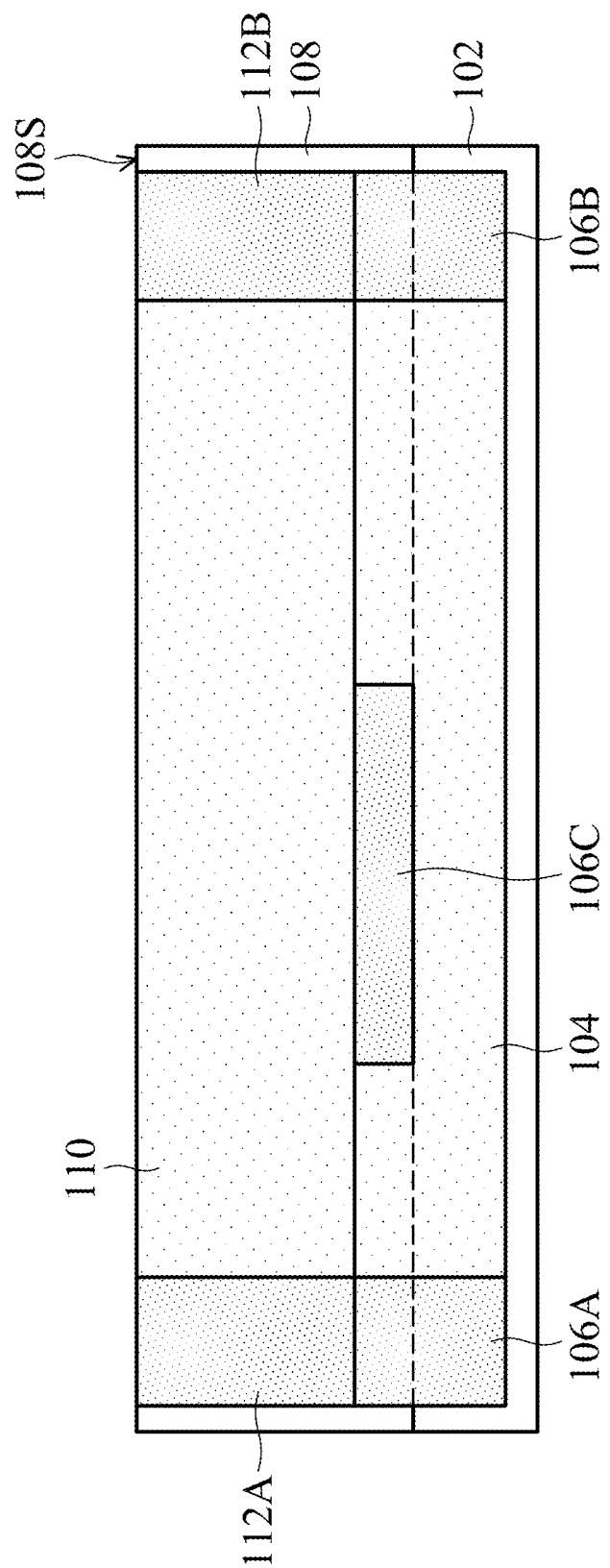
FIG. 3A is a cross-sectional view of a semiconductor device in one step of a manufacturing method of the semiconductor device according with some embodiments of the present disclosure.
Figure 3B:
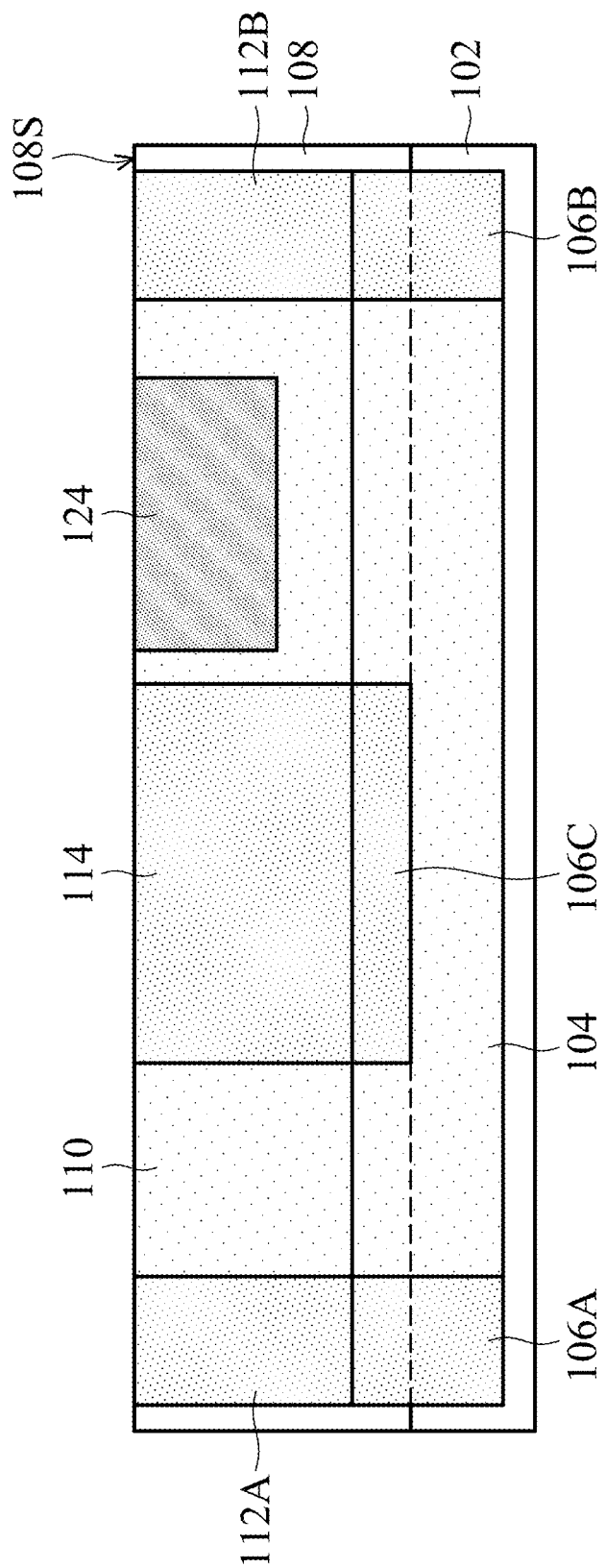
FIG. 3B is a cross-sectional view of a semiconductor device in one step of a manufacturing method of the semiconductor device according with some embodiments of the present disclosure.
Figure 3C:
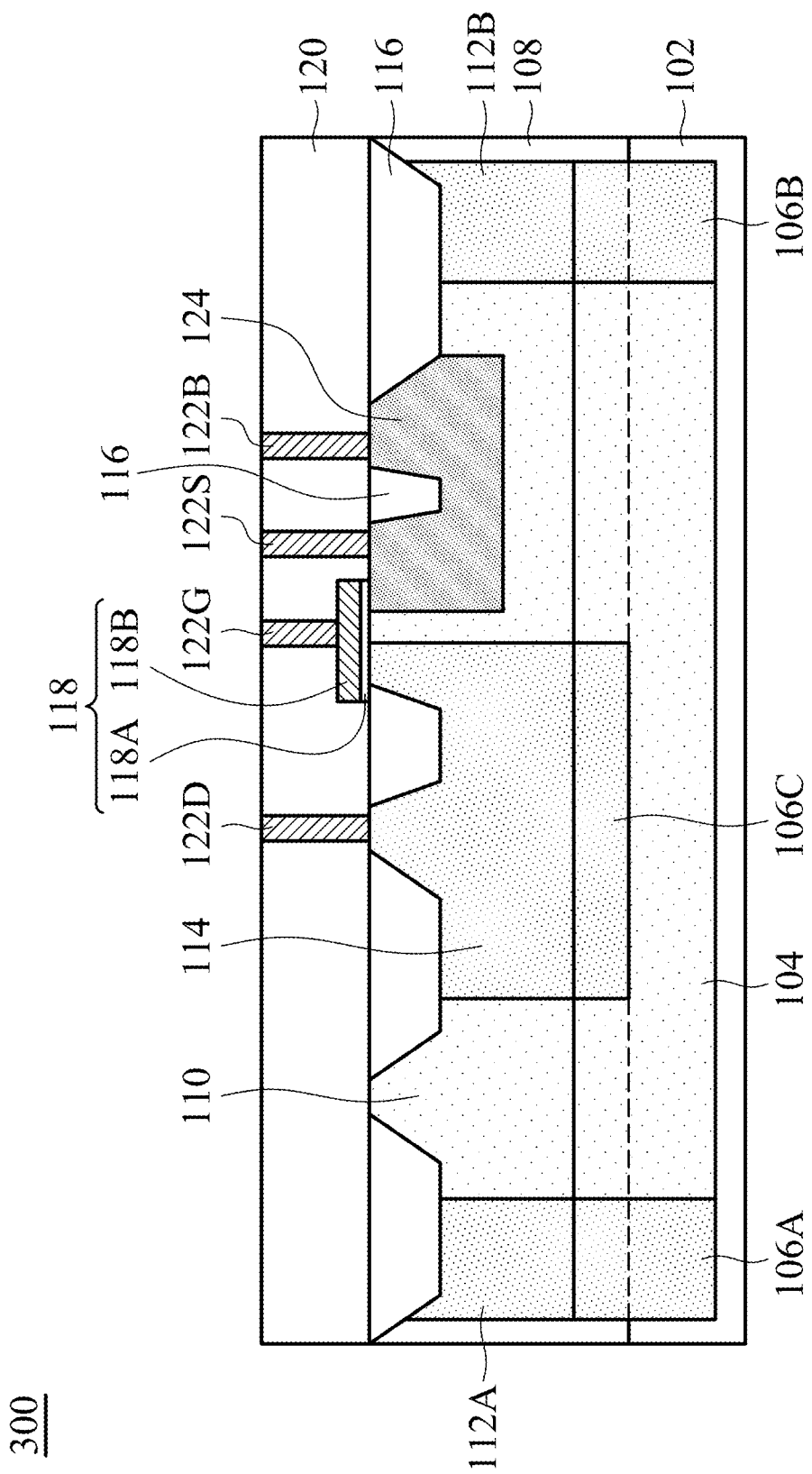
FIG. 3C is a cross-sectional view of a semiconductor device in one step of a manufacturing method of the semiconductor device according with some embodiments of the present disclosure.

It should be noted that the exemplary embodiment set forth in FIGS. 1A-2C is merely for the purpose of illustration. In addition to the embodiment set forth in FIGS. 1A-2C, the second conductive type doped region may have other configuration as shown in FIGS. 3A-3C. This will be described in detail in the following description. Therefore, the inventive concept and scope are not limited to the exemplary embodiment shown in FIGS. 1A-2C.

FIG. 3A is a cross-sectional view of a semiconductor device in one step of a manufacturing method of the semiconductor device according with some embodiments of the present disclosure. The structure shown in FIG. 3A is formed by the similar steps shown in FIGS. 1A-1C, and the second conductive type doped region is not formed yet.

Subsequently, referring to FIG. 3B, the second conductive type doped region 114 is formed in the first conductive type second well region 110. The second conductive type doped region 114 is in direct contact with the second conductive type third buried layer 106C.

In addition, as shown in FIG. 3B, a first conductive type doped region 124 may be further formed in the first conductive type second well region 110. In some embodiments of the present disclosure, the first conductive type doped region 124 is in direct contact with the top surface 108S of the epitaxial layer 108, and does not physically contact the second conductive type doped region 114, the second conductive type third buried layer 106C, the second conductive type first buried layer 106A, the second conductive type second buried layer 106B, the second conductive type first well region 112A and the second conductive type second well region 112B.

In addition, in some embodiments of the present disclosure, the second conductive type third buried layer 106C does not physically contact the second conductive type first buried layer 106A, the second conductive type second buried layer 106B, the second conductive type first well region 112A, the second conductive type second well region 112B and the first conductive type doped region 124.

Subsequently, FIG. 3C is a cross-sectional view of a semiconductor device in one step of a manufacturing method of the semiconductor device according with some embodiments of the present disclosure. As shown in FIG. 3C, the interlayer dielectric layer 120, the drain contact plug 122D, the gate contact plug 122G, the source contact plug 122S and the bulk contact plug 122B are formed by the similar step shown in FIG. 1D to form the semiconductor device 300.

The drain contact plug 122D is electrically connected to the second conductive type doped region 114. The source contact plug 122S is electrically connected to the first conductive type doped region 124, and is electrically connected to the first conductive type second well region 110 through the first conductive type doped region 124. In addition, in some embodiments of the present disclosure, the bulk contact plug 122B is also electrically connected to the first conductive type doped region 124, and is electrically connected to the first conductive type second well region 110 through the first conductive type doped region 124.

In summary, the embodiment of the present disclosure replaces a portion of the second conductive type buried layer of the known semiconductor device with the first conductive type first well region to increase the breakdown voltage of the semiconductor device. For example, the breakdown voltage of the semiconductor device may be greater than 120V. Therefore, the semiconductor device may be used in the application with a higher operation voltage. For example, the semiconductor device may be used in the application in which the operation voltage is higher than or equal to 100V. In addition, since the embodiment of the present disclosure merely change the configuration of the doped regions without increasing the thickness of the epitaxial layer or replacing the Si substrate with the semiconductor-on-insulator (SOI), the breakdown voltage of the semiconductor device may be increased without greatly increasing the manufacturing cost. In addition, in some embodiments of the present disclosure, a reduced surface field structure (RESURF structure) is formed in the semiconductor device. Therefore, the breakdown voltage of the semiconductor device may be increased further.

It should be noted that although the above description merely illustrates embodiments with the first conductive type being N-type and the second conductive type being P-type, those skilled in the art will appreciate that the first conductive type may be P-type with the second conductive type being N-type.

In addition, it should be noted that the drain and source mentioned above in the present disclosure are switchable since the definition of the drain and source is related to the voltage connecting thereto.

Note that the above element sizes, element parameters, and element shapes are not limitations of the present disclosure. Those skilled in the art can adjust these settings or values according to different requirements. It should be understood that the semiconductor device and method for manufacturing the same of the present disclosure are not limited to the configurations of FIGS. 1A to 3C. The present disclosure may merely include any one or more features of any one or more embodiments of FIGS. 1A to 3C. In other words, not all of the features shown in the figures should be implemented in the semiconductor device and method for manufacturing the same of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a first conductive type first well region;
a second conductive type epitaxial layer disposed over the substrate, the first conductive type first well region being disposed in the substrate and the second conductive type epitaxial layer;
a second conductive type first buried layer and a second conductive type second buried layer disposed in the substrate and the second conductive type epitaxial layer, wherein the second conductive type first buried layer and the second conductive type second buried layer are disposed at opposite sides of the first conductive type first well region, respectively, wherein the first conductive type is different from the second conductive type;
a first conductive type second well region disposed in the second conductive type epitaxial layer and being in direct contact with the first conductive type first well region;

a second conductive type third buried layer disposed in the first conductive type first well region and/or the first conductive type second well region;

a second conductive type doped region disposed in the first conductive type second well region;

a gate structure disposed over a top surface of the second conductive type epitaxial layer;

a drain contact plug electrically connected to either the first conductive type second well region or the second conductive type doped region; and a source contact plug electrically connected to the other of the first conductive type second well region or the second conductive type doped region.

2. The semiconductor device as claimed in claim 1, further comprising a second conductive type first well region and a second conductive type second well region disposed in the second conductive type epitaxial layer, wherein the second conductive type first well region and the second conductive type second well region are disposed at opposite sides of the first conductive type second well region, respectively.

3. The semiconductor device as claimed in claim 2, wherein the second conductive type first well region is in direct contact with the second conductive type first buried layer, and the second conductive type second well region is in direct contact with the second conductive type second buried layer.

4. The semiconductor device as claimed in claim 2, wherein the second conductive type third buried layer does not contact the second conductive type first buried layer, the second conductive type second buried layer, the second conductive type first well region, the second conductive type second well region and the second conductive type doped region.

5. The semiconductor device as claimed in claim 2, wherein the second conductive type third buried layer contacts the second conductive type doped region, and the second conductive type third buried layer does not contact the second conductive type first buried layer, the second conductive type second buried layer, the second conductive type first well region and the second conductive type second well region.

6. The semiconductor device as claimed in claim 1, further comprising:

a first conductive type doped region disposed in the first conductive type second well region, wherein the source contact plug is electrically connected to the first conductive type second well region through the first conductive type doped region, and the drain contact plug is electrically connected to the second conductive type doped region.

7. The semiconductor device as claimed in claim 1, wherein the second conductive type third buried layer is disposed only in the first conductive type first well region.

8. The semiconductor device as claimed in claim 1, wherein the second conductive type third buried layer is disposed in the first conductive type first well region and the first conductive type second well region.

9. The semiconductor device as claimed in claim 1, wherein the second conductive type third buried layer is disposed only in the first conductive type second well region.

10. The semiconductor device as claimed in claim 1, wherein a breakdown voltage of the semiconductor device is greater than or equal to 120V.

* * * * *